United States Patent [19]
Machida et al.

[11] Patent Number: 5,151,587
[45] Date of Patent: Sep. 29, 1992

[54] IMAGE SENSOR HAVING AN ARRAY OF OPERATIVE AND DUMMY BIPOLAR TRANSISTORS AND PAIRS OF PIXEL SELECTING SWITCHES CONNECTED THERETO

[75] Inventors: Satoshi Machida; Yukito Kawahara; Hiroshi Mukainakano, all of Tokyo, Japan

[73] Assignee: Seiko Instruments Inc., Japan

[21] Appl. No.: 637,489

[22] Filed: Jan. 4, 1991

[30] Foreign Application Priority Data

Jan. 10, 1990 [JP] Japan ..................................... 2-3241

[51] Int. Cl.$^5$ ............................................. H01J 40/14
[52] U.S. Cl. .............................. 250/208.1; 358/213.12
[58] Field of Search ...................... 250/208.1, 214 C; 358/213.16, 213.12, 213.31

[56] References Cited

U.S. PATENT DOCUMENTS 4,819,071  4/1989  Nakamura ..................... 358/213.16

FOREIGN PATENT DOCUMENTS 0141486  5/1985  European Pat. Off. .
0260858  3/1988  European Pat. Off. .
3842279  6/1989  Fed. Rep. of Germany ... 250/214 C Primary Examiner—David C. Nelms
Assistant Examiner—T. Davenport
Attorney, Agent, or Firm—Bruce L. Adams; Van C. Wilks

[57] ABSTRACT

The image sensor is comprised of an array of operative bipolar transistors. Another array of optically shielded dummy bipolar transistors are formed adjacently to the operative bipolar transistors. Reset switches are connected to base regions of the operative and dummy bipolar transistors so as to reduce variation in dark image output, to ensure linearity of output signal, and to eliminate image storage.

14 Claims, 2 Drawing Sheets

FIG. 2
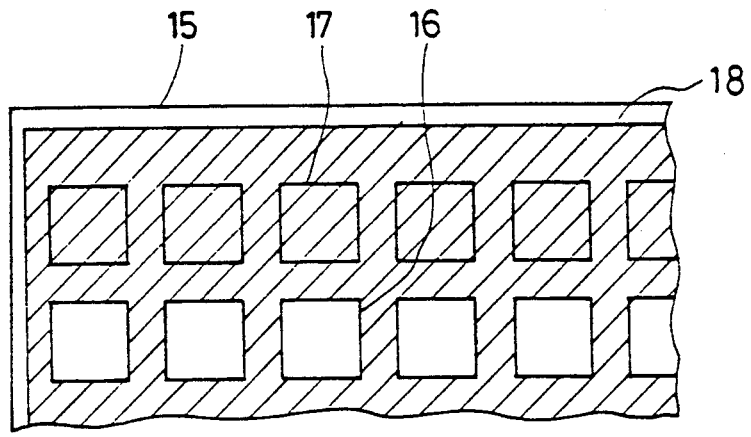
FIG. 3
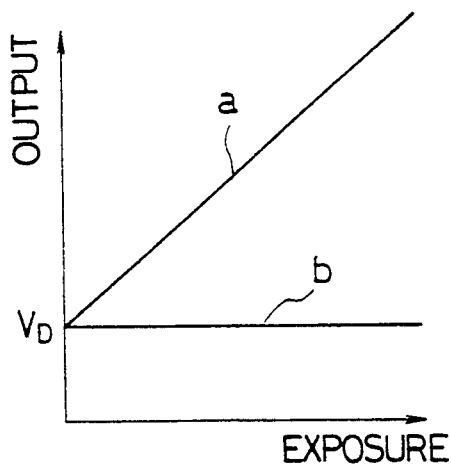
FIG. 4 PRIOR ART
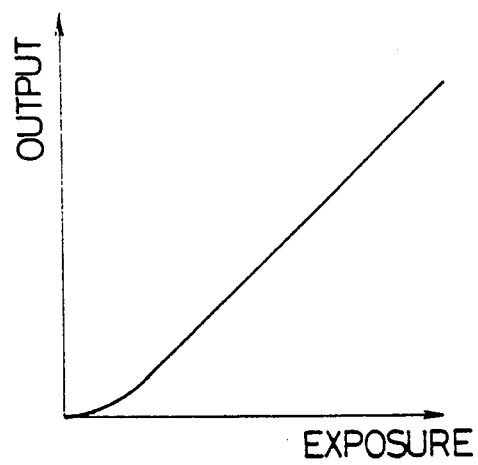
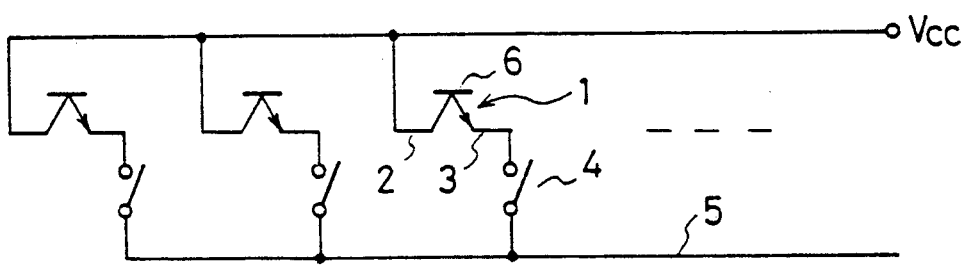
FIG. 5
PRIOR ART

IMAGE SENSOR HAVING AN ARRAY OF OPERATIVE AND DUMMY BIPOLAR TRANSISTORS AND PAIRS OF PIXEL SELECTING SWITCHES CONNECTED THERETO

BACKGROUND OF THE INVENTION

The present invention relates to an image sensor used in facsimile machine and image scanner for converting an optical signal into an electric signal.

Conventionally, there is known an image sensor operative such that a photocarrier is stored in a base of a bipolar transistor and an electric siganl signal is taken from an emitter thereof. FIG. 5 shows one example of such a conventional image sensor. A bipolar transistor 1 of NPN type has a collector 2 held at constant potential $V_{CC}$. An emitter 3 of the bipolar transistor 1 is connected to a common signal line 5 through a pixel selecting switch 4. A base 6 of the bipolar transistor 1 is held floating. The pixel selecting switches 4 are successively turned on to read out a photocarrier stored in the respective bipolar transisters 1. During the reading operation, the bipolar transistor can output electric charge several tens to hundreds times as much as the stored photocarrier according to the amplification function of the transistor.

In the above noted conventional image sensor, since the base 6 of the bipolar transistor 1 is held floating, some amount of electric charge remains in the base after the previous output operation, thereby affecting the next output operation to generate a storage image phenomenon. Further, since an emitter junction must be forward-biased to effect transistor operation, a part of the photocarrier is used for forward-biasing of the emitter junction. Therefore, as shown in FIG. 4, the output power cannot linearly increase in a lower light exposure range.

SUMMARY OF THE INVENTION

An object of the present invention is to the eliminate storage image phenomenon and to improve the output characteristic of the image sensor. The inventive image sensor is comprised of a main bipolar transistor array and shielded or covered additional bipolar transisitor array disposed adjacently in parallel to the main bipolar transister array. A reset switch is connected to a base of each transistor of the main and additional arrays.

In the above constructed image sensor, after the output operation of each pixel, the corresponding pair of reset switches connected to the corresponding pair of the bipolar transistors in the parallel arrays are operated to reset the corresponding bases to a constant potential to thereby initialize the bipolar transistor pair in a given state. Accordingly, such construction can effectively avoid storage image phenomenon which could be caused by remaining electric charge in the base region. Further, the reset potential of the base is set to a relatively high level so as to charge into the base some amount of initial electric charge sufficient to forward-bias the emitter junction. By such operation, the output power is made proportional to incident light intensity in a relatively low light exposure range.

BRIEF DESCRIPTION OF THE DRAWINGS

FIG. 2 is an illustrative diagram showing an arrangement of base regions and a shielding film on the inventive image sensor;

FIG. 3 is a graph showing a photo-electric conversion characteristic of the inventive image sensor;

FIG. 4 is a graph showing a photo-electric conversion characteristic of the conventional image sensor; and FIG. 5 is a structural diagram of the conventional image sensor.

DETAILED DSESCRIPTION OF EMBODIMENT

Figure 1:
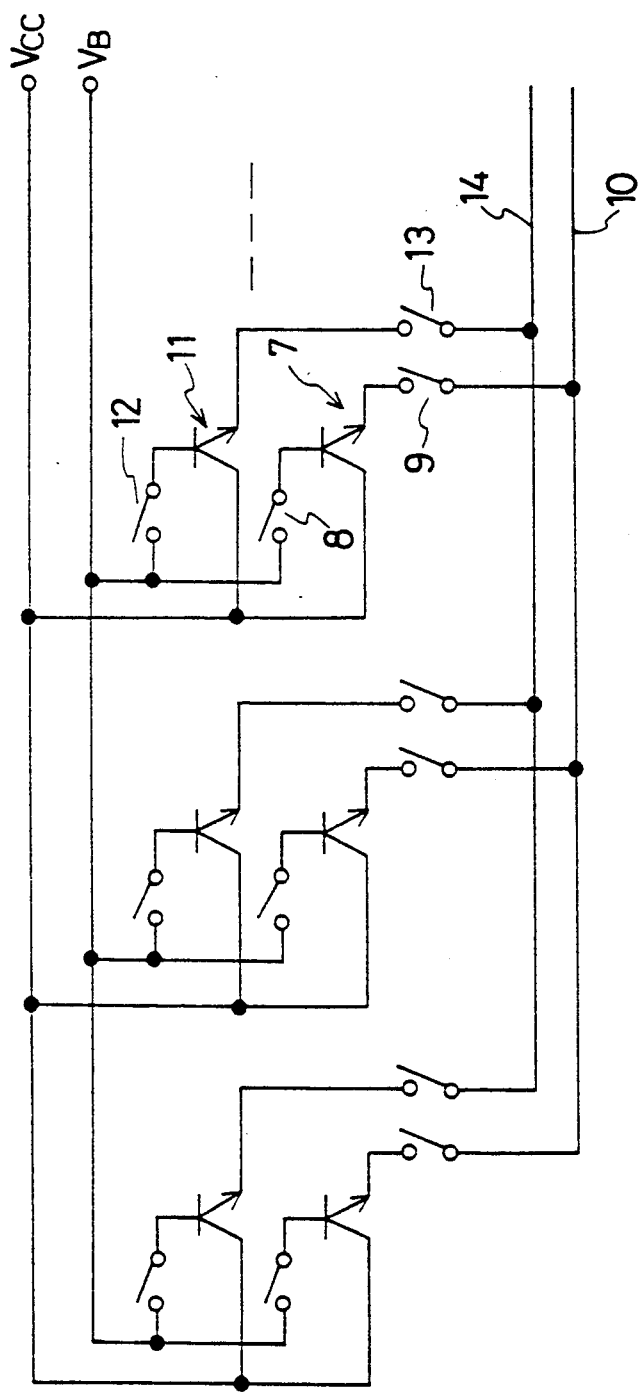
FIG. 1 is a circuit diagram showing an embodiment of the inventive image sensor.

Hereinafter, an embodiment of the invention will be described in conjunction with the drawings. Referring to FIG. 1, the inventive image sensor is comprised of a main array composed of bipolar transistors 7, each having a collector held at a constant potential $V_{CC}$. A base region of each bipolar transistor 7 is opened or exposed such that an induced photocarrier is stored in the base. This base is connected to a corresponding reset switch 8 and is provided with a base reset potential $V_B$ through the reset switch 8. An emitter of each bipolar transistor 7 is connected to a common image signal line 10 through a pixel selecting switch 9. A plurality of the bipolar transistors 7 are linearly arranged in array, and another plurality of dummy bipolar transistors 11 are also linearly arranged in array correspondingly to the operative bipolar transistors 7. The dummy bipolar transistor 11 has the same structure as that of the operative bipolar transisitor 7, but is masked or covered over its base region by a shielding film composed of aluminum etc. Each dummy bipolar transistor 11 has a collector connected to the $V_{CC}$ line, a base receptive of the reset potential $V_B$ through a reset switch 12 and an emitter connected to a common offset signal line 14 through another pixel selecting switch 13.

FIG. 2 shows an arrangement of the base regions and the shielding film in the above constructed image sensor. A semiconductor chip 15 is formed linearly with exposed base regions 16 which define a receiving region of incident light. Masked base regions 17 of the dummy bipolar transistors are disposed adjacently in parallel to the exposed base regions 16. The base regions 17 of the dummy bipolar transistors are covered by an aluminum light-shielding film 18 which is selectively removed from the base regions 16 of the operative bipolar transistors.

Next, the description is given for the operation of the inventive image sensor with reference to FIG. 1. The pair of pixel selecting switches 9 and 13 connected to the corresponding pair of operative and dummy bipolar transistors 7 and 11 are concurrently turned on to enable the pair of transistors 7 and 11 to output electric charge to the common signal lines 10 and 14, respectively. The pairs of pixel selecting switches 9 and 13 are successively turned on so that an image signal and an offset signal are fed to the common signal lines 10 and 14, respectively, on a time-sequential basis. After the outputting or reading operation, the emitters of the pair of bipolar transistors 7 and 11 are held to a constant potential through the pixel selecting switches 9 and 13, repectively. However, some amount of electric charge remains in their bases.

Then, the pair of base reset switches 8 and 12 are turned on so that the base potential of the pair of bipolar transistors 7 and 11 are set to $V_B$. Thereafter, the pair of base reset switches 8 and 12 and the pair of pixel selecting 9 and 13 are turned off so that the operative bipolar transistor 7 is initialized to effect new storing operation of photocarrier in its base rehgion in response to incident light. Since the base of the dummy bipolar transistor 11 is optically shielded, no photocarrier is stored so that the dummy bipolar transistor 11 continously provides an offset signal having a level identical to that of a dark image signal of the operative 6 bipolar transistor 7. Since the potential $V_B$ is set to a relatively high level effective to sufficiently forward-bias the emitter junctions when the pixel selecting switches 9 and 13 are turned on, the output of the bipolar transistor 7 has good linearity in the lower exposure light region. The bases of the pair of bipolar transistors 7 and 11 are reset to $V_B$ each reading operation, hence the influence of previous operation is completely removed to thereby avoid storage image phenomenon.

FIG. 3 shows photo-electric conversion characteristics of the inventive image sensor. The line a indicates the photo-electric conversion characteristic of the operative bipolar transistor 7, and the line b indicates the photo-electric conversion characteristic of the dummy bipolar transistor 11. The offset potential $V_D$ of the dark image signal may vary dependently on the position of pixels; however the pair of bipolar transistors 7 and 11 are closely disposed to each other such that the offset potential $V_D$ does not differ between them. Accordingly, the common image signal line 10 and the common offset signal line 14 can be connected to a differential amplifier (not shown), which can provide an output signal proportional to the incident light amount or intensity and which can suppress variation of the dark image output.

The operation timing of each switch can be controlled by a scanning circuit, which may be integrated into the same semiconductor chip. The differential amplifier is also intergrated into the same semiconductor chip.

As described above, according to the present invention, there can be provided a simple structure of image sensor effective to suppress variation in the dark image output, to ensure good linearity of output signal, and to eliminate image storage.

What is claimed is:

1. An image sensor comprising:
   an array of operative bipolar transistors for effecting photo-electric conversion of incident light;
   another array of dummy bipolar transistors optically shielded from incident light and disposed adjacently and correspondingly to the operative bipolar transistors to constitute pairs of the operative and dummy bipolar transistors;
   pairs of reset switches connected to the corresponding pairs of the transistors at their base regions to concurrently reset each pair of the operative and dummy bipolar transistors; and
   pairs of pixel selecting switches connected to the corresponding pairs of the transistors at their emitters.

2. An image sensor as claimed in claim 1; wherein the operative bipolar transistors have exposed base regions which define a receiving region of incident light, and the dummy bipolar transistors have masked base regions formed linearly on a semiconductor chip, the masked base regions of the dummy bipolar transistors being disposed adjacently in parallel to the exposed base regions.

3. An image sensor as claimed in claim 1; wherein the operative bipolar transistors have exposed base regions and the dummy bipolar transistors have covered base regions, and wherein the base regions of the dummy bipolar transistors are covered by an aluminum light-shielding film which is selectively removed from the base regions of the operative bipolar transistors.

4. An image sensor comprising:
   an array of operative bipolar transistors for effecting phoyo-electric conversion of the incident light;
   another array of dummy bipolar transistors optically shielded from incident light and disposed adjacently and correspondingly to the operative bipolar transistors to constitute pairs of the operative and dummy bipolar transistors;
   pairs of reset switches connected to the corresponding pairs of the transistors at their base regions to concurrently reset each pair of the operative and dummy bipolar transistors;
   pairs of pixel selecting switches connected to the corresponding pair of operative and dummy bipolar transistors and concurrently turned on to enable the pair of transisitors to output electric charge to common signal lines, respectively; and
   pairs of pixel selecting switches successively turned on so that an image signal and an offset signal are fed to the common signal lines respectively on a time-sequential basis.

5. An image sensor as claimed in claim 4; wherein the operative bipolar transistors have exposed base regions which define a receiving of incident light, and the dummy bipolar transistors have masked base regions formed linearly on a semiconductor chip, the masked base regions of the dummy bipolar transistors being disposed adjacently in parallel to the exposed base regions.

6. An image sensor as claimed in claim 4; wherein the operative bipolar transistors have exposed base regions and the dummy bipolar transistors have covered base regions, and wherein the base regions of the dummy bipolar transistors are covered by an aluminum light-shielding film which is selectively removed from the base regions of the operative bipolar transistors.

7. An image sensor comprising:
   an array of operative bipolar transistors for effecting photo-electric conversion of incident light;
   another array of dummy bipolar transistors optically shielded from incident light and disposed adjacently and correspondingly to the operative bipolar transistors to constitute pairs of the operative and the dummy bipolar transistors;
   pairs of reset switches connected to the corresponding pairs of the transistors at their base regions to concurrently reset each pair of the operative and dummy bipolar transistors; and
   pairs of pixel selecting switches connected to the corresponding pairs of the transistors at their emitters and wherein the collectors of the transistors are held at a constant potential.

8. An image sensor as claimed in claim 7; wherein the operative bipolar transistors have exposed base regions which define a receiving region of incident light, and the dummy bipolar transistors have masked base regions formed linearly on a semiconductor chip, the masked base region of the dummy bipolar transistors being disposed adjacently in parallel to the exposed base regions.

9. An image sensor as claimed in claim 7; wherein the operative bipolar transistors have exposed base regions and the dummy bipolar transistors have covered base regions, and wherein the base regions of the dummy bipolar transistors are covered by an aluminum light-shielded film which is selectively removed from the base regions of the operative bipolar transistors.

10. An image sensor comprising:
- a first array of bipolar transistors for effecting photo-electric conversion when base regions thereof are receptive of incident light;
- a second array of bipolar transistors for effecting photo-electric conversion when base regions thereof are receptive of incident light, the first and second arrays being disposed adjacently to each other to define pairs of bipolar transistors including one from the first and one from the second array;
- means exposing the regions of the first base array and shielding the base region of the second array from incident light;
- reset switches connected to bases of each pair of bipolar transistors to effect the concurrent reset of the bipolar transistors; and
- selecting switches connected to emitters of each pair of bipolar transistors to effect the output of electric charge of selected transistors.

11. An image sensor according to claim 10, wherein the base regions of the first array are disposed linearly and the base regions of the second array are disposed parallel to the base regions of the first array and adjacent thereto.

12. An image sensor according to claim 10, wherein the means for shielding the base regions of the second array comprises an aluminum light-shielding film removed from the base regions of the first array.

13. An image sensor according to claim 10, wherein the emitters of the transistors of the first array and the emitters of the transistors of the second array are connected to common signal lines through the selecting switches.

14. An image sensor according to claim 10, wherein the collectors of all of the transistors are connected together for the application of a constant potential.

* * * * *